United States Patent
Nakashima

(10) Patent No.: US 12,137,543 B2
(45) Date of Patent: Nov. 5, 2024

(54) POWER CONVERSION APPARATUS

(71) Applicant: Mitsubishi Electric Corporation, Tokyo (JP)

(72) Inventor: Yukio Nakashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 419 days.

(21) Appl. No.: 17/627,305

(22) PCT Filed: Jul. 29, 2019

(86) PCT No.: PCT/JP2019/029664
§ 371 (c)(1),
(2) Date: Jan. 14, 2022

(87) PCT Pub. No.: WO2021/019642
PCT Pub. Date: Feb. 4, 2021

(65) Prior Publication Data
US 2022/0272877 A1   Aug. 25, 2022

(51) Int. Cl.
*H05K 7/20*       (2006.01)
*H02M 1/084*      (2006.01)
*H02M 5/458*      (2006.01)

(52) U.S. Cl.
CPC ........ *H05K 7/20909* (2013.01); *H02M 1/084* (2013.01); *H02M 5/458* (2013.01)

(58) Field of Classification Search
CPC .. H02M 1/084; H02M 5/458; H05K 7/20909; H05K 7/2089; H05K 7/209
See application file for complete search history.

(56) References Cited

U.S. PATENT DOCUMENTS 8,724,358 B2 * 5/2014 Takizawa .............. H02M 7/003
                                                363/141
8,908,375 B2 * 12/2014 Konishide .......... H05K 7/20936
                                                361/710
(Continued)

FOREIGN PATENT DOCUMENTS

GB      2541966 A      3/2017
JP   2007134471 A      5/2007
(Continued)

OTHER PUBLICATIONS

JP-2017112690-A Translation.*
(Continued)

*Primary Examiner* — Jacob R Crum
*Assistant Examiner* — Matthew Sinclair Muir
(74) *Attorney, Agent, or Firm* — Buchanan Ingersoll & Rooney PC

(57) ABSTRACT

A power conversion apparatus includes: a converter main circuit converting AC power into DC power; an inverter main circuit converting, into AC power, the DC power obtained by conversion by the converter main circuit; and a common cooler cooling first switching elements included in the inverter main circuit and second switching elements included in the converter main circuit. The first switching elements are modularized in units of one or more elements to form first modules. The second switching elements are modularized in units of one or more elements to form second modules. The first and second modules are mounted on a first surface of a base of the cooler. The first modules are arranged in a first direction on the first surface. The second modules are arranged such that two or more second modules are continuously arranged in a second direction orthogonal to the first direction on the first surface.

9 Claims, 11 Drawing Sheets

(56) References Cited

U.S. PATENT DOCUMENTS

| | | | | |
|---|---|---|---|---|
| 10,453,770 B2* | 10/2019 | Takizawa | ............ | H05K 7/20854 |
| 2009/0195066 A1* | 8/2009 | Tanaka | .................. | H02M 7/003 |
| | | | | 307/9.1 |
| 2019/0244874 A1* | 8/2019 | Yoshikawa | ....... | H01L 23/49822 |

FOREIGN PATENT DOCUMENTS

| | | | | |
|---|---|---|---|---|
| JP | 2017112690 A | * | 6/2017 | |
| JP | 6429720 B2 | | 11/2018 | |

OTHER PUBLICATIONS

International Search Report (PCT/ISA/210) with English translation and Written Opinion (PCT/ISA/237) mailed on Sep. 3, 2019, by the Japan Patent Office as the International Searching Authority for International Application No. PCT/JP2019/029664.

Notification of Reason for Refusal dated Dec. 14, 2021 in corresponding JP Patent Application No. 2021-536484.

Office Action dated Jun. 14, 2022, issued in corresponding Indian Patent Application No. 202227003276, 5 pages.

\* cited by examiner

Tmax = 76.7K
Tmin = 66.0K
ΔT = 10.7K

Tmax = 82.6K
Tmin = 60.7K
ΔT = 21.9K

Tmax = 79.2K
Tmin = 63.2K
ΔT = 16.0K

POWER CONVERSION APPARATUS

FIELD

The present invention relates to a power conversion apparatus including a converter main circuit and an inverter main circuit.

BACKGROUND

Patent Literature 1 below discloses a configuration in which rectangular two-element modules, or two-in-one modules, of respective phases included in an inverter main circuit are arranged in a direction orthogonal to a direction of the flow of cooling air from a cooler, and the two-element modules are each disposed with its long side extending in the direction orthogonal to the direction of the flow of the cooling air. Patent Literature 1 describes that, with this configuration, the length in the direction of the flow of the cooling air can be reduced and thus the cooling efficiency can be improved. In addition, Patent Literature 1 describes that a similar arrangement is applied also to the modules included in a converter main circuit so that the cooling efficiency can be improved.

CITATION LIST

Patent Literature

Patent Literature 1: Japanese Patent No. 6429720

SUMMARY

Technical Problem

However, Patent Literature 1 described above merely discloses an arrangement configuration in which consideration is given only to the modules of the inverter main circuit or to the modules of the converter main circuit. That is, there are no descriptions or suggestions as to how the modules of both the inverter main circuit and the converter main circuit are arranged when they are cooled by a common cooler. Assume a configuration in which the modules of both the inverter main circuit and the converter main circuit are cooled by a common cooler. In this case, it is necessary to consider various points of view such as heat generated by adjacent modules and characteristics of the cooling air flowing in the cooler, in addition to the direction of the flow of the cooling air. Therefore, in the case of a configuration in which the modules of both the inverter main circuit and the converter main circuit are cooled by the common cooler, even if the technique of Patent Literature 1 is applied as it is, the cooling efficiency cannot necessarily be improved.

The present invention has been made in view of the above, and an object of the present invention is to obtain a power conversion apparatus capable of improving the cooling efficiency in a configuration in which the modules of both the inverter main circuit and the converter main circuit are cooled by a common cooler.

Solution to Problem

In order to solve the above-described problem and achieve the object, a power conversion apparatus according to the present invention includes: a converter main circuit to convert AC power into DC power; an inverter main circuit to convert, into AC power, the DC power obtained by conversion by the converter main circuit; and a cooler to cool first switching elements included in the inverter main circuit and second switching elements included in the converter main circuit, the cooler being used as a common cooler. The first switching elements are modularized in units of one or more elements to form first modules. The second switching elements are modularized in units of one or more elements to form second modules. The first and second modules are mounted on a first surface that is a module mounting surface of a base of the cooler. The first modules are arranged in a first direction on the first surface. The second modules are arranged such that two or more second modules are continuously arranged in a second direction orthogonal to the first direction on the first surface.

Advantageous Effects of Invention

The power conversion apparatus according to the present invention achieves the effect of enabling the cooling efficiency to be improved in a configuration in which the modules of both the inverter main circuit and the converter main circuit are cooled by a common cooler.

DESCRIPTION OF EMBODIMENTS

Hereinafter, a power conversion apparatus according to embodiments of the present invention will be described in detail with reference to the accompanying drawings. Note that the present invention is not limited to the following embodiments. In addition, although a power conversion apparatus for driving an electric vehicle will be described as an example in embodiments below, this is not intended to exclude application to other uses. Furthermore, in the accompanying drawings, for ease of understanding, the scales of respective members may be shown differently from what they are in reality. This may also hold true for the relationships between the drawings.

First Embodiment

Figure 1:
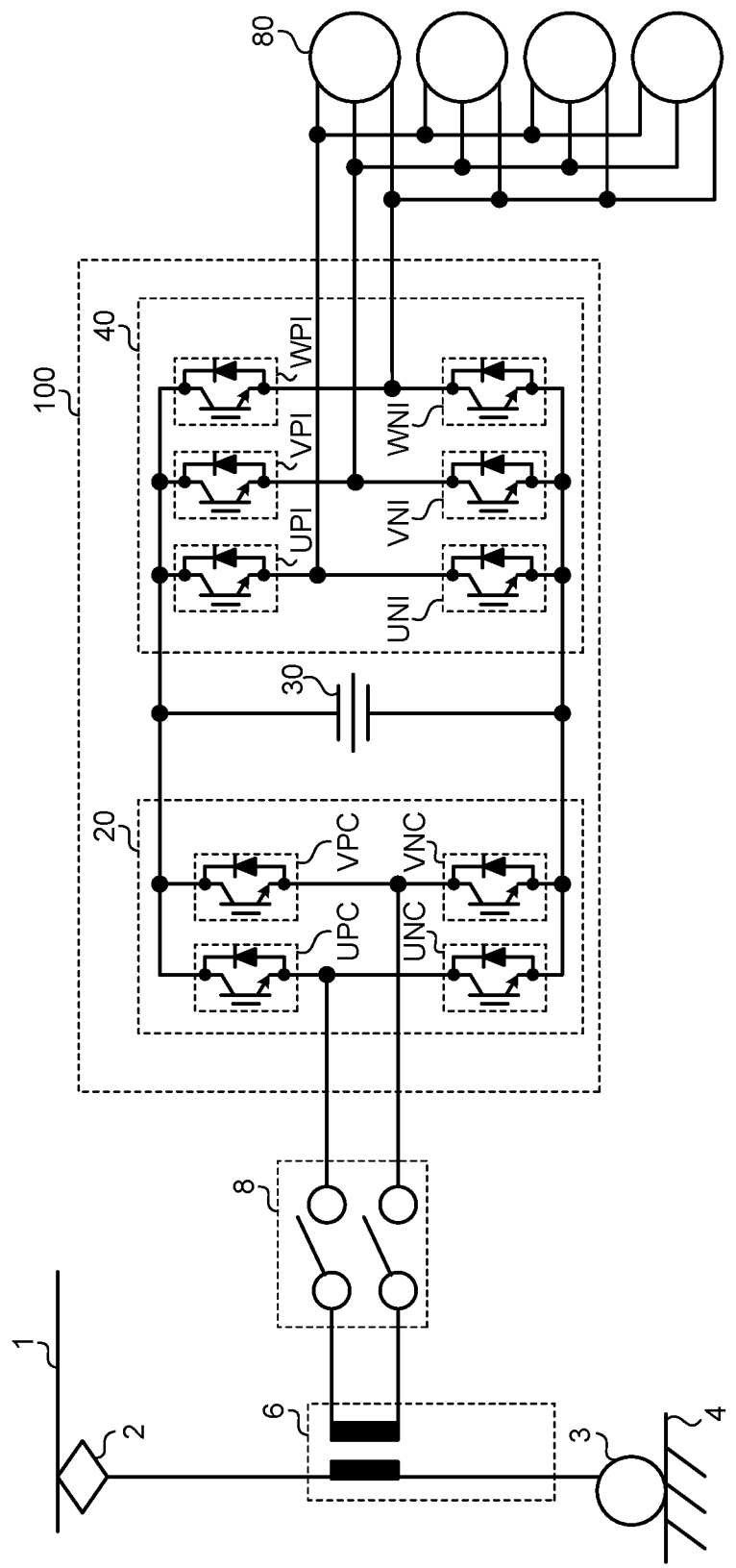
FIG. 1 is a diagram illustrating a circuit configuration of a power conversion apparatus according to a first embodiment.

FIG. 1 is a diagram illustrating a circuit configuration of a power conversion apparatus according to a first embodiment. FIG. 1 illustrates a basic circuit configuration of a power conversion unit of a power conversion apparatus 100 to be applied to an electric vehicle to which alternating current is input. The power conversion apparatus 100 includes a converter main circuit 20, an inverter main circuit 40, and a filter capacitor 30. The converter main circuit 20 converts AC power into DC power. The inverter main circuit 40 converts, into AC power, the DC power obtained by the conversion by the converter main circuit 20. That is, the power conversion apparatus 100 according to the first embodiment is an apparatus that performs power conversion twice, that is, changing AC power to DC power and then converting the DC power into AC power again.

A contactor s is disposed at an input end of the power conversion apparatus 100. A transformer 6 is connected to the contactor B. Four motors 80 are connected to an output and of the power conversion apparatus 100. The four motors so drive the electric vehicle. An induction motor is suitable for the motors so.

One and of a primary winding of the transformer 6 is connected to an overhead line 1 via a current collector 2. An opposite end of the primary winding of the transformer 6 is connected to a rail 4 via a wheel 3. The rail 4 provides a ground potential. The power supplied from the overhead line 1 is input to the primary winding of the transformer 6 via the current collector 2. The power generated in a secondary winding of the transformer 6 is supplied to the converter main circuit 20 via the contactor 8.

The contactor 8 is disposed between the secondary winding of the transformer 6 and the converter main circuit 20, and switches between supplying and not supplying power. Note that a configuration in which both of two AC input lines are turned on or off is illustrated as an example in FIG. 1, but the contactor may be disposed on one of the AC input lines.

The converter main circuit 20 includes a positive arm and a negative arm. The positive arm includes switching elements UPC and VPC. The negative arm includes switching elements UNC and VNC. The switching element UPC and the switching element UNC are connected in series to form a U-phase leg. The switching element VPC and the switching element VNC are connected in series to form a V-phase leg. The U-phase leg and the V-phase leg are connected in parallel to each other to form a single-phase bridge circuit. Note that, in the following description, the U phase may be referred to as a "first phase", and the V phase may be referred to as a "second phase".

The converter main circuit 20 converts the input AC voltage into a desired DC voltage by performing pulse width modulation (PMM) control on the switching elements UPC, VPC, UNC, and VNC, and outputs the DC voltage.

The filter capacitor 30 and the inverter main circuit 40 are connected in parallel to an output end of the converter main circuit 20. The filter capacitor 30 serves as a DC power source. The filter capacitor 30 smooths the DC voltage output from the converter main circuit 20. The inverter main circuit 40 receives the voltage of the filter capacitor 30 as input, converts the voltage into an AC voltage of a desired voltage and a desired frequency, and applies the AC voltage to the motors 80.

The inverter main circuit 40 includes a positive arm including switching elements UPI, VPI, and WPI and a negative arm including switching elements UNI, VNI, and MI. The switching element UPI and the switching element UNI are connected in series to form a U-phase leg. The switching element VPI and the switching element VNI are connected in series to form a V-phase leg. The switching element WPI and the switching element WNI are connected in series to form a U-phase leg. The U-phase, V-phase, and W-phase legs are connected in parallel to each other to form a three-phase bridge circuit. Note that, in the following description, the U phase may be referred to as the "first phase", the V phase may be referred to as the "second phase", and the K phase may be referred to as a "third phase".

The inverter main circuit 40 performs PMN control on the switching elements UPI, VPI, WPI, UNI, VNI, and MNI to convert the DC voltage smoothed by the filter capacitor into an AC voltage of a desired voltage and a desired frequency, and applies the AC voltage to the motors 80.

Note that, in the following description, when the switching elements of the converter main circuit 20 and the inverter main circuit 40 are distinguished from each other without reference numerals, the switching elements of the inverter main circuit 40 may be referred to as "first switching elements", and the switching elements of the converter main circuit 20 may be referred to as "second switching elements". In addition, the first and second switching elements may be collectively referred to as "main circuit elements".

An insulated gate bipolar transistor (IGBT) with an anti-parallel diode incorporated therein illustrated in FIG. 1 is an example of the switching elements UPC, VPC, UNC, VNC, UPI, VPI, NPI, URI, VNI, and WNI. However, other switching elements may also be used. A metal-oxide-semiconductor field-effect transistor (MOSFET) is another example of the switching elements UPC, VPC, UNC, VNC, UPI, VPI, WPI, WI, VNI, and WNI. Moreover, as a material for the switching elements, in addition to silicon (Si), silicon carbide (Sic), gallium nitride (GaN), gallium oxide ($Ga_2O_3$), diamond, and the like, which are wide bandgap semiconductors, may also be used. When the switching elements are formed of a wide bandgap semiconductor-based material, it is possible to achieve low loss and high-speed switching.

Figure 2:
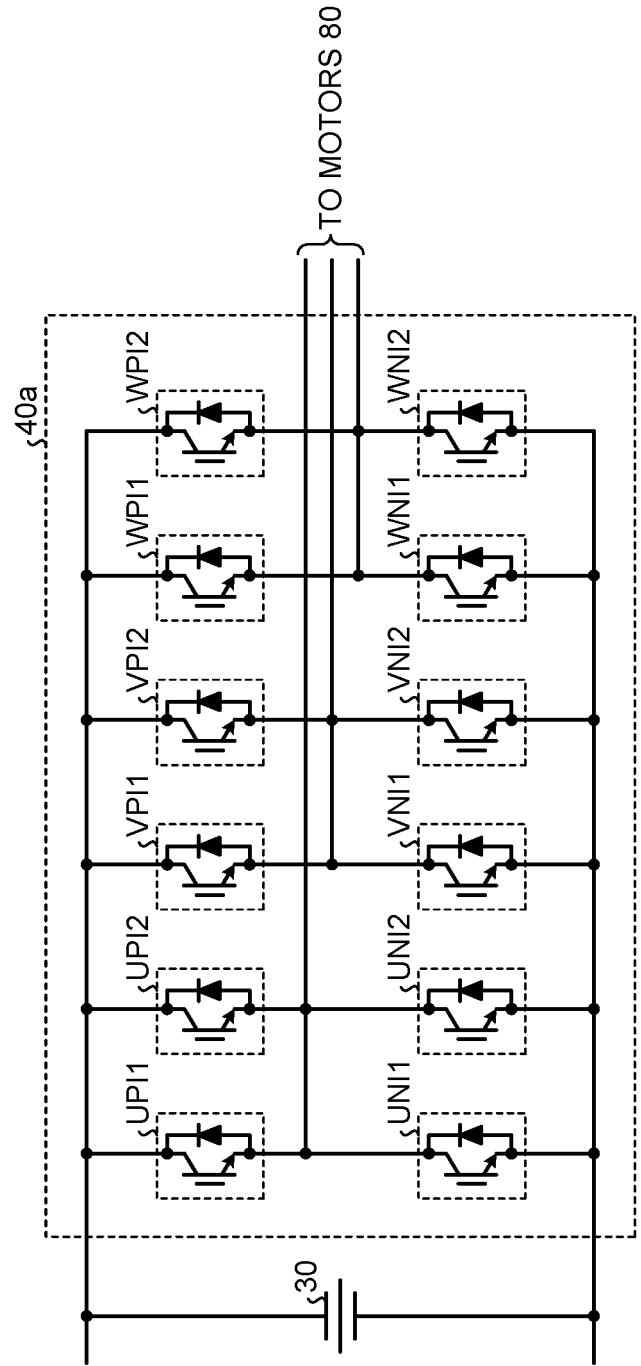
FIG. 2 is a diagram illustrating a circuit configuration of an inverter main circuit in the first embodiment, different from that illustrated in FIG. 1.

FIG. 2 is a diagram illustrating a circuit configuration of an inverter main circuit in the first embodiment, different from that illustrated in FIG. 1. The circuit configuration of an inverter main circuit 40a illustrated in FIG. 2 is different from the circuit configuration of the inverter main circuit 40 illustrated in FIG. 1 in that two switching elements are connected in parallel in each phase arm.

In FIG. 2, switching elements UPI1 and UPI2 are connected in parallel in a U-phase positive arm, switching elements UNI1 and UNI2 are connected in parallel in a U-phase negative arm, switching elements VPI1 and VPI2 are connected in parallel in a V-phase positive arm, switching elements VNI1 and VNI2 are connected in parallel in a V-phase negative arm, switching elements WPI1 and WPI2 are connected in parallel in a N-phase positive arm, and switching elements WNI1 and WNI2 are connected in parallel in a W-phase negative am. It is possible to lower the rated value of the current capacity of each switching element by connecting the switching elements of each phase arm in parallel.

Figure 3:
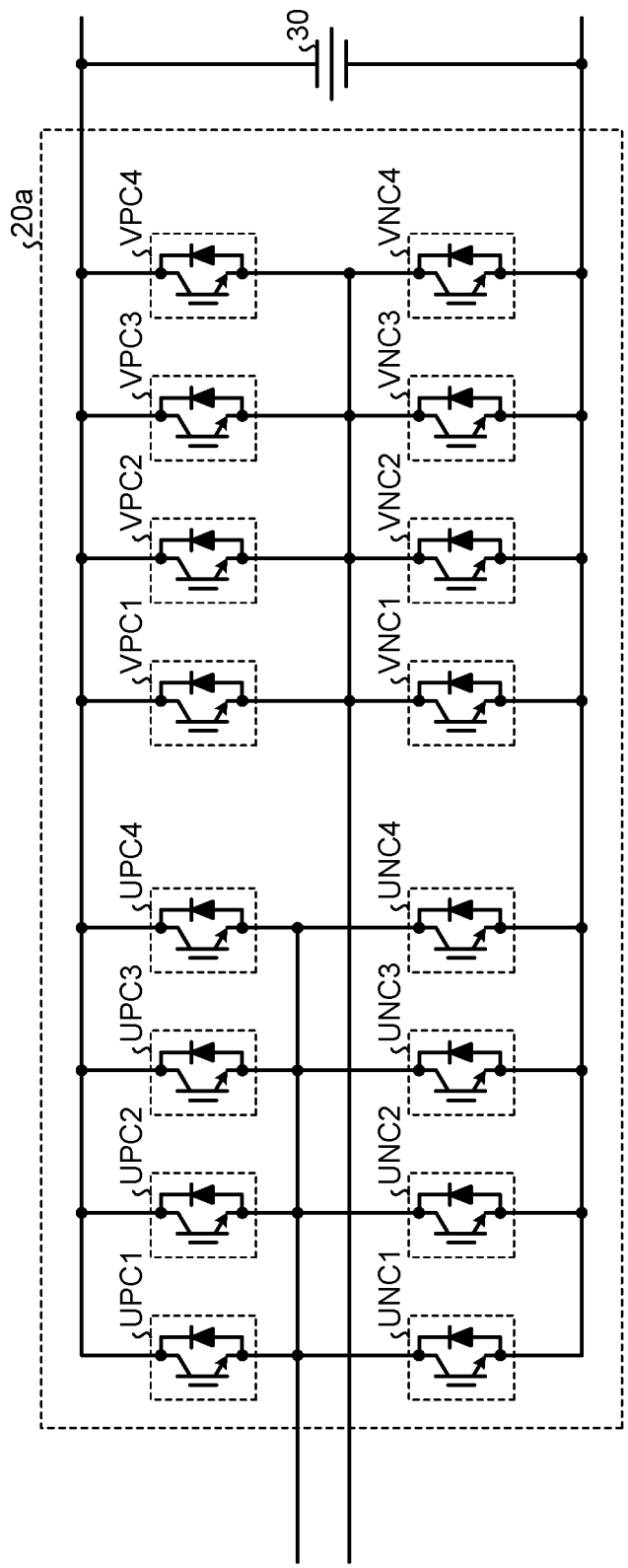
FIG. 3 is a diagram illustrating a circuit configuration of a converter main circuit in the first embodiment, different from that illustrated in FIG. 1.

FIG. 3 is a diagram illustrating a circuit configuration of a converter main circuit in the first embodiment, different from that illustrated in FIG. 1. The circuit configuration of a converter main circuit 20a illustrated in FIG. 3 is different from the circuit configuration of the converter main circuit 20 illustrated in FIG. 1 in that four switching elements are connected in parallel in each phase arm.

In FIG. 3, switching elements UPC1, UPC2, UPC3, and UPC4 are connected in parallel in a U-phase positive arm, switching elements UNC1, UNC2, UNC3, and UNC4 are connected in parallel in a U-phase negative arm, switching elements VPC1, VPC2, VPC3, and VPC4 are connected in parallel in a V-phase positive arm, and switching elements VNC1, VNC2, VNC3, and VNC4 are connected in parallel in a V-phase negative arm. It is possible to lower the rated value of the current capacity of each switching element by connecting the switching elements of each phase arm in parallel.

Figure 4:
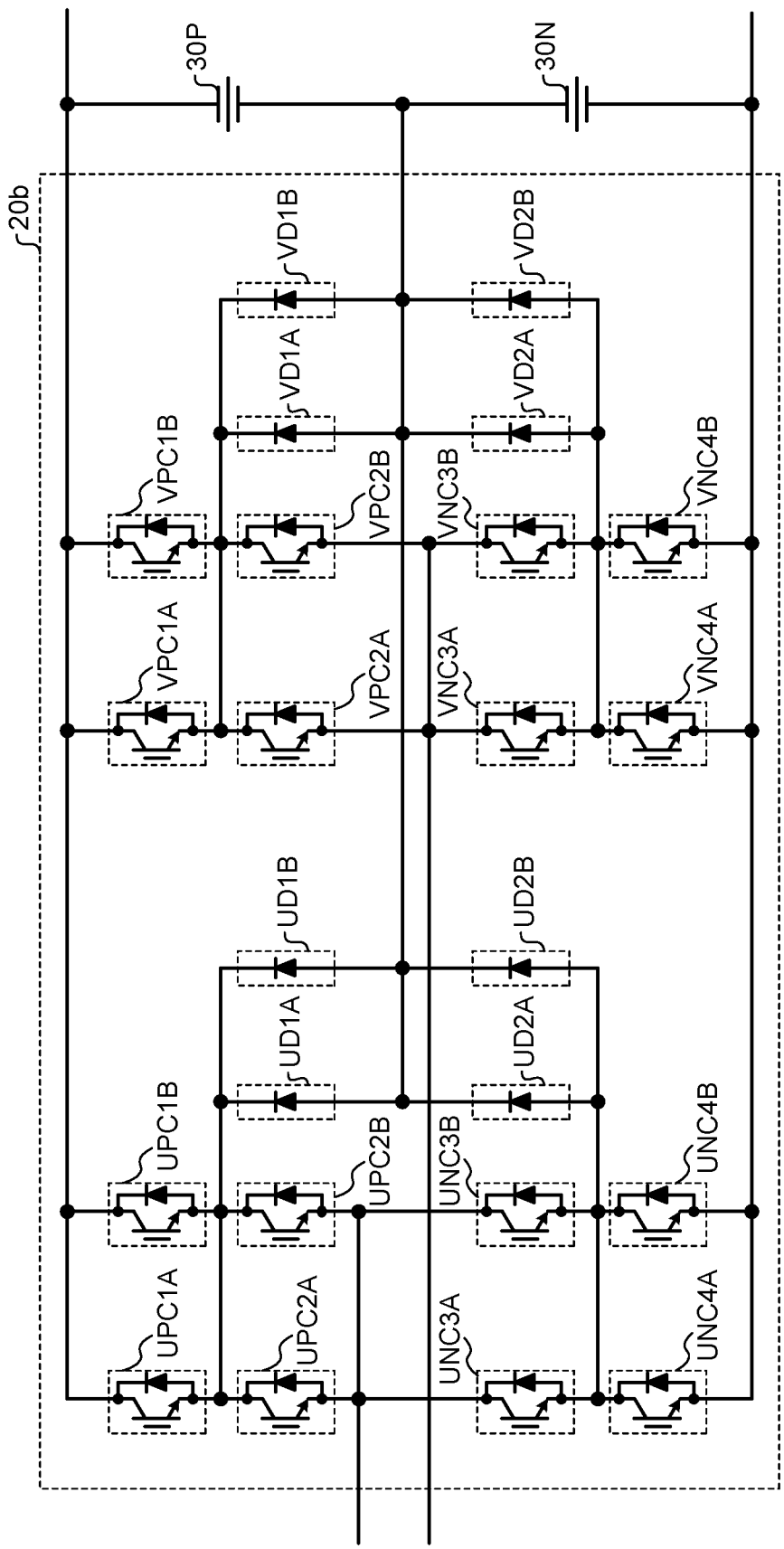
FIG. 4 is a diagram illustrating a circuit configuration of a converter main circuit in the first embodiment, different from those illustrated in FIGS. 1 and 3.

FIG. 4 is a diagram illustrating a circuit configuration of a converter main circuit in the first embodiment, different from those illustrated in FIGS. 1 and 3. The converter main circuit 20 illustrated in FIG. 1 has a two-level circuit configuration. Meanwhile, a converter main circuit 20b illustrated in FIG. 4 has a three-level circuit configuration. The converter main circuit 20b is different from the converter main circuit 20 in this respect.

In FIG. 4, switching elements UPC1A and UPC1B connected in parallel and switching elements UPC2A and UPC2B connected in parallel are connected in series in a U-phase positive arm. The cathode sides of diodes UD1A and UD1B connected in parallel are connected to this connection point. Each anode side of the diodes UD1A and UD1B is connected to a midpoint which is a connection point of filter capacitors 30P and 30N. Similarly, switching elements UNC3A and UNC3B connected in parallel and switching elements UNC4A and UNC4B connected in parallel are connected in series in a U-phase negative arm. Each anode side of diodes UD2A and UD2B connected in parallel is connected to this connection point. The cathode sides of the diodes UD2A and UD2B are connected to the midpoint which is the connection point of the filter capacitors 30P and 30N.

A V-phase positive arm and a V-phase negative arm are configured in a similar manner to the U-phase positive arm and the U-phase negative arm, respectively. Specifically, switching elements VPC1A and VPC1B connected in parallel and switching elements VPC2A and VPC2B connected in parallel are connected in series in the V-phase positive arm. The cathode sides of diodes VD1A and VD1B connected in parallel are connected to this connection point. Each anode side of the diodes VD1A and VD1B is connected to the midpoint which is the connection point of the filter capacitors 30P and 30N. Similarly, switching elements VNC3A and VNC3B connected in parallel and switching elements VNC4A and VNC4B connected in parallel are connected in series in the V-phase negative arm. Each anode side of diodes VD2A and VD2B connected in parallel is connected to this connection point. The cathode sides of the diodes VD2A and VD2B are connected to the midpoint which is the connection point of the filter capacitors 30P and 30N.

Whether to use a two-level converter main circuit or a three-level converter main circuit is appropriately determined according to needs of a user or an operating environment. With regard to an electric vehicle, strict regulations have been placed on inductive interference in a specific frequency band so as to prevent malfunction of ground devices. Therefore, in the case of reducing harmonic current with high accuracy, a three-level circuit is often chosen. Note that a switching element to be used for a three-level circuit has an advantage over a switching element to be used for a two-level circuit in that the voltage resistance of each switching element can be reduced by about half.

Figure 5:
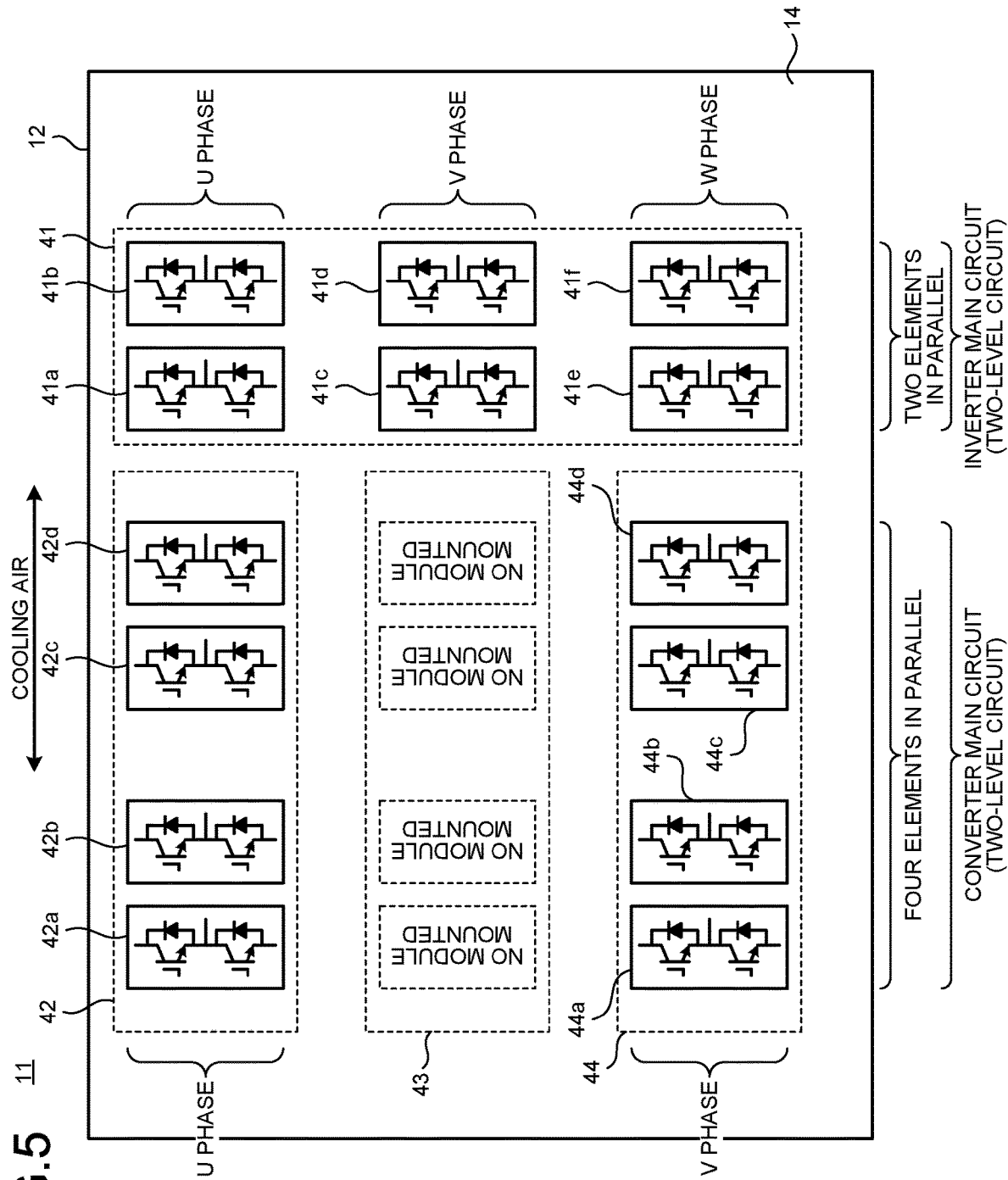
FIG. 5 is a diagram illustrating a first exemplary arrangement in which main circuit elements of the power conversion apparatus according to the first embodiment are mounted on a cooler.

FIG. 5 is a two-dimensional diagram illustrating a first exemplary arrangement in which the main circuit elements of the power conversion apparatus according to the first embodiment are mounted on a cooler. FIG. 5 illustrates a plurality of modules mounted on a base 12 of a cooler 11. Specifically, FIG. 5 illustrates an example in which the inverter main circuit 40a illustrated in FIG. 2 and the converter main circuit 20a illustrated in FIG. 3 are mounted an the base 12 of the cooler 11 that is a common cooler.

In FIG. 5, each module is a two-element module configured such that two switching elements are housed in one module. Each module is mounted on a first surface 14 of the base 12. The first surface 14 is a module mounting surface of the base 12. Note that an element substrate on which each module is mounted is not illustrated in FIG. 5. Furthermore, although not illustrated in FIG. 5, a heat pipe or a radiating fin for cooling the switching elements housed in each module is provided on a second surface which is opposite the first surface 14. An arrow indicates the direction of the flow of cooling air that flows into and out of the cooler 11.

FIG. 5 illustrates four sections on the first surface 14. The four sections are a first section 41, a second section 42, a third section 43, and a fourth section 44. The first section 41 extends in a first direction orthogonal to a second direction in which cooling air flows. The second section 42, the third section 43, and the fourth section 44 are adjacent to the first section 41 along the second direction, and the second section 42, the third section 43, and the fourth section 44 are arranged in this order along the first direction.

In the first section 41, a module 41a corresponds to the switching elements UPI1 and UNI1 in FIG. 2, and a module 41b corresponds to the switching elements UPI2 and UNI2 in FIG. 2. Similarly, a module 41c corresponds to the switching elements VPI1 and VNI1 in FIG. 2, and a module 41d corresponds to the switching elements VPI2 and VNI2 in FIG. 2. A module 41e corresponds to the switching elements WPI1 and WNI1 in FIG. 2, and a module 41f corresponds to the switching elements WPI2 and WNI2 in FIG. 2. In this manner, the modules 41a to 41f including all the first switching elements included in the inverter main circuit 40a are arranged in the first section 41. That is, the modules 41a to 41f are modules housing switching elements that operate as U-phase, V-phase, and W-phase switching elements of the two-level inverter main circuit. Note that the modules 41a to 41f may be referred to as "first modules" in the following description.

Next, in the second section 42, a module 42a corresponds to the switching elements UPC1 and UNC1 in FIG. 3. Similarly, a module 42b corresponds to the switching elements UPC2 and UNC2 in FIG. 3, a module 42c corresponds to the switching elements UPC3 and UNC3 in FIG. 3, and a module 42d corresponds to the switching elements UPC4 and UNC4 in FIG. 3. In this manner, the modules 42a to 42d including second switching elements that operate as U-phase switching elements among the second switching elements included in the two-level converter main circuit 20a are arranged in the second section 42.

The third section 43 is a non-mounting section in which no module is arranged as illustrated. The reason why the third section 43 is a non-mounting section will be described later.

Furthermore, in the fourth section 44, a module 44a corresponds to the switching elements VPC1 and VNC1 in FIG. 3. Similarly, a module 44b corresponds to the switching elements VPC2 and VNC2 in FIG. 3, a module 44c corresponds to the switching elements VPC3 and VNC3 in FIG. 3, and a module 44d corresponds to the switching elements VPC4 and VNC4 in FIG. 3. In this manner, the modules 44a to 44d including second switching elements that operate as V-phase switching elements among the second switching elements included in the two-level converter main circuit 20a are arranged in the fourth section 44.

Note that the modules 42a to 42d and 44a to 44d may be referred to as "second modules" in the following description.

Figure 6:
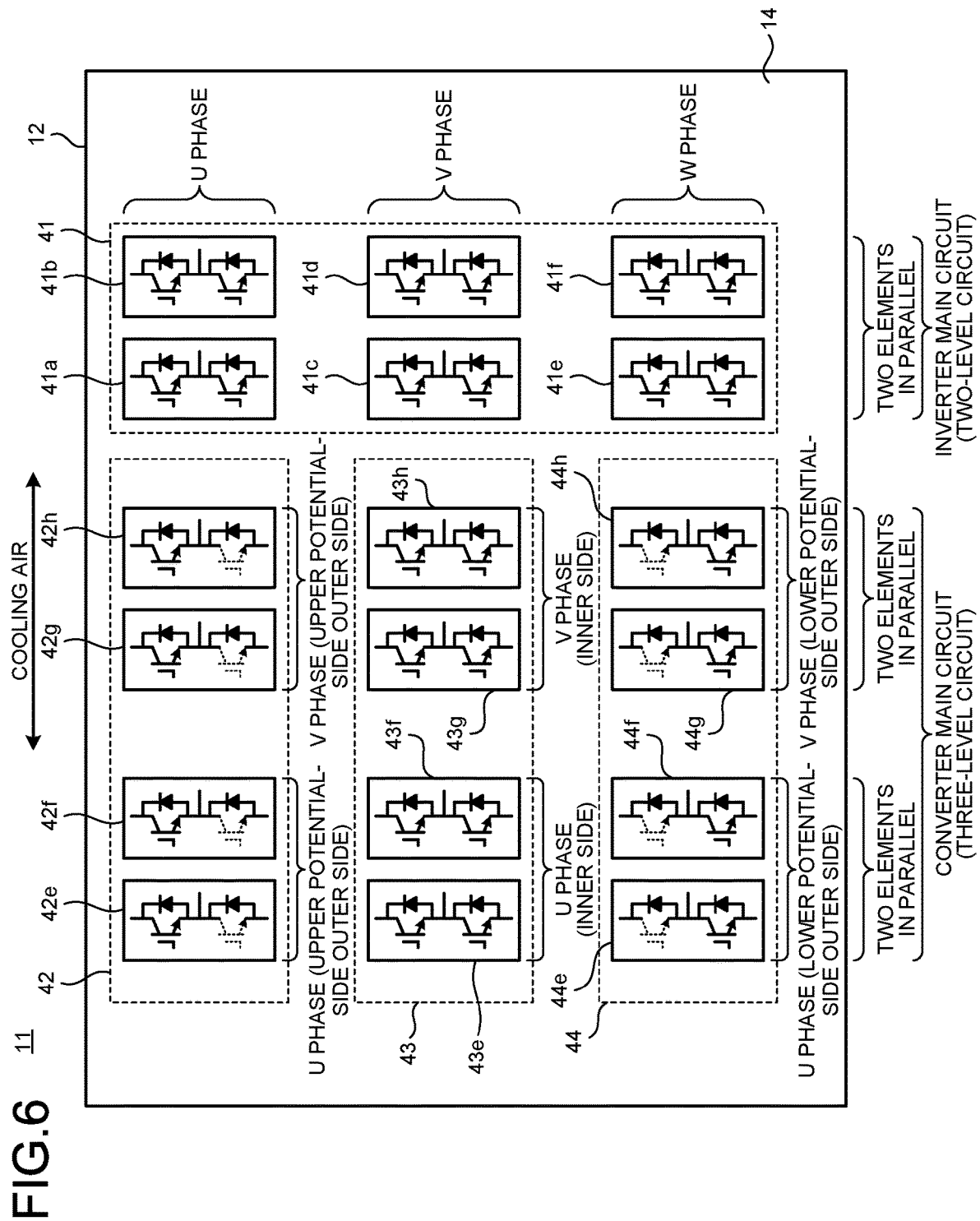
FIG. 6 is a diagram illustrating a second exemplary arrangement in which the main circuit elements of the power conversion apparatus according to the first embodiment are mounted on the cooler.

FIG. 6 is a two-dimensional diagram illustrating a second exemplary arrangement in which the main circuit elements of the power conversion apparatus according to the first embodiment are mounted on the cooler. Specifically, FIG. 6 illustrates an example in which the inverter main circuit 40a illustrated in FIG. 2 and the converter main circuit 20b illustrated in FIG. 4 are mounted on the base 12 of the cooler 11 that is a common cooler.

As with FIG. 5, FIG. 6 illustrates the first section 41, the second section 42, the third section 43 and the fourth section 44 on the first surface 14. The definitions of these sections are the same as those in FIG. 5.

Modules to be arranged in the first section 41 of FIG. 6 are the same as those illustrated in FIG. 5, and description thereof is omitted here.

Next, in the second section 42, a module 42e corresponds to the switching element UPC1A and the diode UD1A in FIG. 4. Note that a combination of the switching element UPC1A and the diode UD1A may be referred to as an "upper potential-side outer element" in the following description. In addition, the part corresponding to the transistor of the lower-side switching element of the module 42e is shown in a light color in FIG. 6 in line with the circuit configuration of FIG. 4. This indicates that the function of the transistor is not used and only the function of the diode is used in the lower-side switching element of the module 42e. The same applies to modules 42f, 42g, and 42h to be described below.

The module 42f corresponds to the switching element UPC1B and the diode UD1B in FIG. 4, the module 42g corresponds to the switching element VPC1A and the diode VD1A in FIG. 4, and the module 42h corresponds to the switching element VPC1B and the diode VD1B in FIG. 4.

As described above, the modules 42e to 42h housing second switching elements that operate as U-phase upper potential-side outer elements among the second switching elements included in the three-level converter main circuit 20b are arranged in the second section 42.

In addition, unlike in FIG. 5, modules 43e to 43h are arranged in the third section 43 as illustrated in FIG. 6. Specifically, the module 43e corresponds to the switching elements UPC2A and UNC3A in FIG. 4. Note that a pair of the switching elements UPC2A and UNC3A may be referred to as an "inner element" in the following description. The same applies to the modules 43f, 43g, and 43h to be described below.

The module 43f corresponds to the switching elements UPC2B and UNC3B in FIG. 4, the module 42g corresponds to the switching elements VPC2A and VNC3A in FIG. 4, and the module 42h corresponds to the switching elements VPC2B and VNC3B in FIG. 4.

Furthermore, in the fourth section 44, a module 44e corresponds to the switching element UNC4A and the diode UD2A in FIG. 4. Note that a combination of the switching element UNC4A and the diode UD2A may be referred to as a "lower potential-side outer element" in the following description. In addition, the part corresponding to the transistor of the upper-side switching element of the module 44e is shown in a light color in FIG. 6 in line with the circuit configuration of FIG. 4. This indicates that the function of the transistor is not used and only the function of the diode is used in the upper-side switching element of the module 44e. The same applies to modules 44f, 44g, and 44h to be described below.

The module 44f corresponds to the switching element UNC4B and the diode UD2B in FIG. 4, the module 44g corresponds to the switching element VNC4A and the diode VD2A in FIG. 4, and the module 44h corresponds to the switching element VNC4B and the diode VD2B in FIG. 4.

As described above, the modules 44e to 44h housing second switching elements that operate as U-phase lower potential-side outer elements among the second switching elements included in the three-level converter main circuit 20b are arranged in the fourth section 44.

Note that the only difference between the exemplary arrangements illustrated in FIGS. 5 and 6 is whether modules are mounted in the third section 43. Even when the modules 42e to 42h illustrated in FIG. 6 are used as the upper potential-side outer elements and the modules 44e to 44h illustrated in FIG. 6 are used as the lower potential-side outer elements in the three-level converter main circuit illustrated in FIG. 6, it is sufficient if the function of the transistors is set to be unused and it is not necessary to arrange different elements. In addition, all the modules can have the same structure. Therefore, a substrate on which the modules are mounted according to the arrangement illustrated in FIG. 5 or 6 can be used as a standard substrate or a standard package. As a result, even if the circuit configuration of the converter main circuit is changed from, for example, a two-level circuit configuration to a three-level circuit configuration according to needs of the user or the operating environment, individual design changes can be reduced to a required minimum.

Note that two modules are arranged in parallel for each phase in the converter main circuit and the inverter main circuit illustrated in FIG. 6, but this is not a limitation. A single module, that is, a single two-element module, may be arranged for each phase in the converter main circuit and the inverter main circuit. Furthermore, four modules are arranged in parallel for each phase in the converter main circuit illustrated in FIG. 5, and two modules are arranged in parallel for each phase in the inverter main circuit illustrated in FIG. 5. However, this is not a limitation. Two modules may be arranged in parallel for each phase in the converter main circuit, and a single two-element module may be arranged for each phase in the inverter main circuit. When the material for the switching element is a non-wide bandgap semiconductor such as silicon (Si), the number of defects in a chip is small even if the switching element has a large capacity, so that the module can be manufactured without deteriorating yields. Accordingly, the standard substrate or the standard package can be downsized.

Furthermore, each module has been described as a two-element module in FIGS. 5 and 6, but the modules are not limited thereto. Each module may be a four-element module configured such that four switching elements are housed in one module. Even when the four-element module is used, the effects described above can be obtained.

Next, a description will be given of the reason why the inner elements are arranged in the third section 43 when the converter main circuit is a three-level circuit.

In general, fluid flowing in a pipe having a uniform pressure loss follows a phenomenon called "Hagen-Poiseuille flow", so that the speed of flow is maximized in the central portion of the pipe, and becomes zero near the wall surface of the pipe. Although simulation results are not illustrated, the same has been confirmed also in fluid simulation for a heat pipe cooler using traveling wind. That is, it has been confirmed that the speed of flow is high in the central portion of the cooler. Utilizing this phenomenon, an element having a large calorific value is disposed in the central portion where the speed of flow is relatively high, in the first embodiment. When the converter main circuit has a three-level circuit configuration, the inner element corresponds to the element having a large calorific value. As already described, the inner elements are arranged in the third section 43 corresponding to the central portion of the cooler, in FIG. 6. This arrangement can improve the cooling efficiency in the cooler. In addition, since the cooling efficiency can be improved, it is possible to further reduce the size and weight of the cooler.

Figure 7:
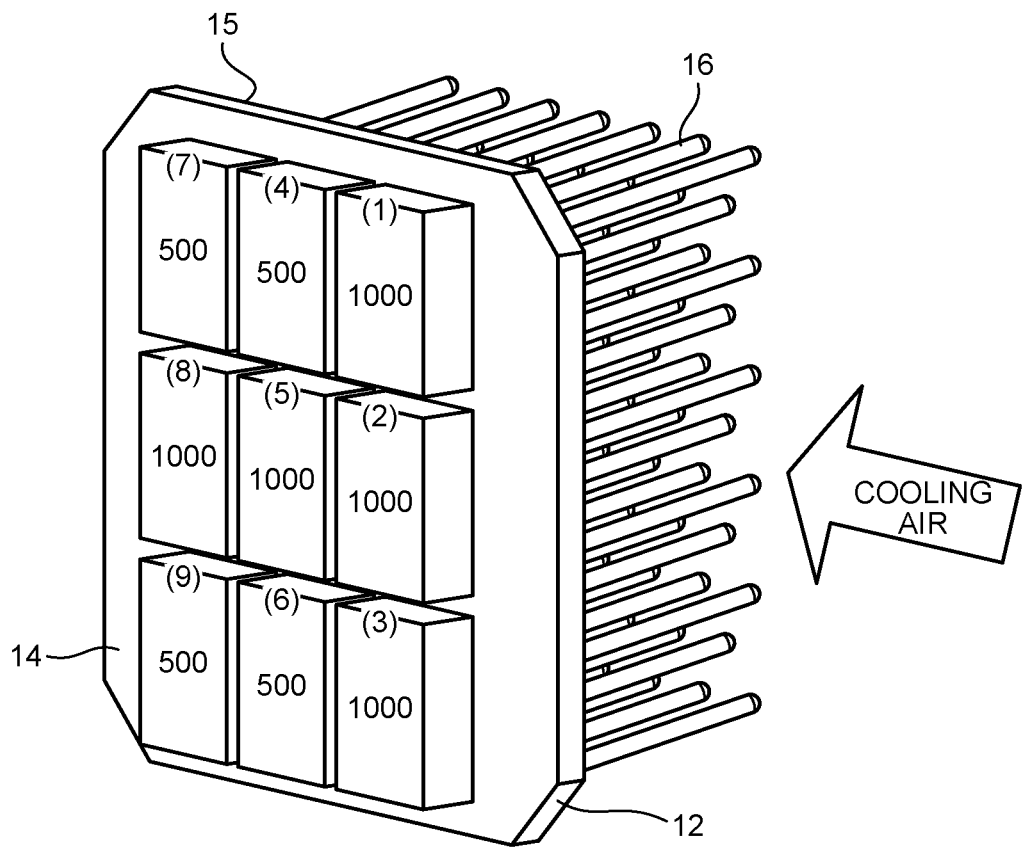
FIG. 7 is a diagram illustrating a first simulation result for describing a reason for arranging the main circuit elements as illustrated in FIG. 5.
Figure 8:
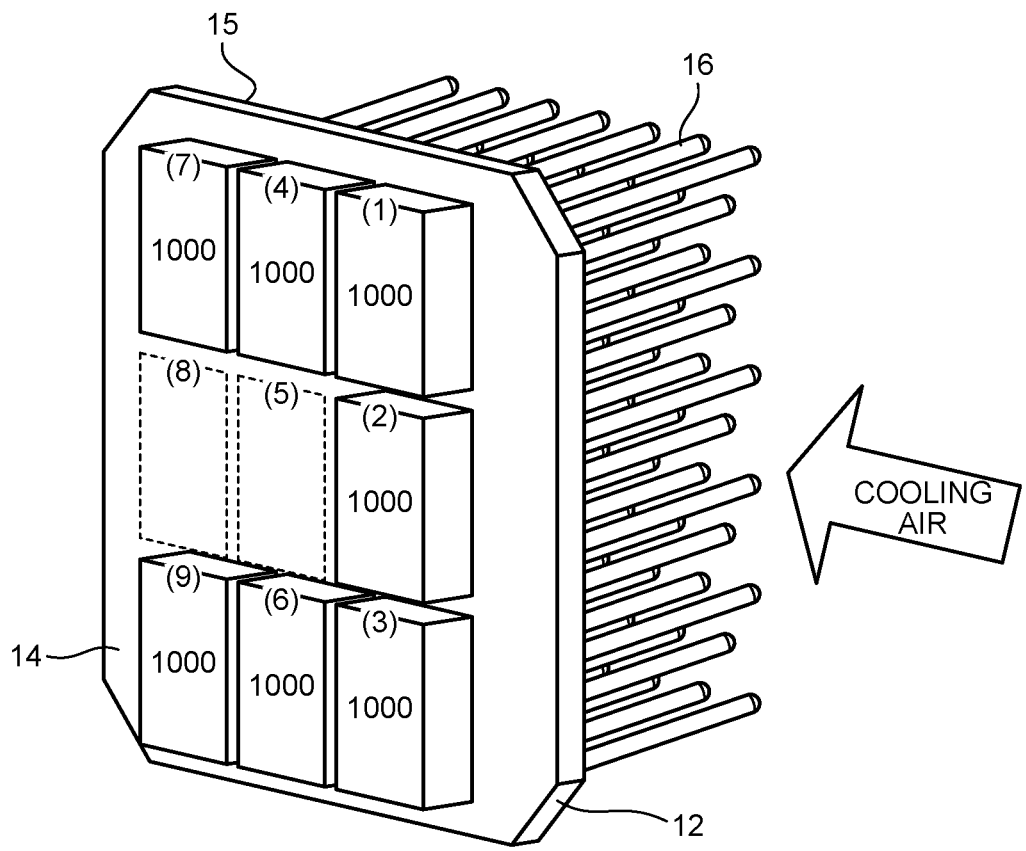
FIG. 8 is a diagram illustrating a second simulation result for describing the reason for arranging the main circuit elements as illustrated in FIG. 5.
Figure 8:
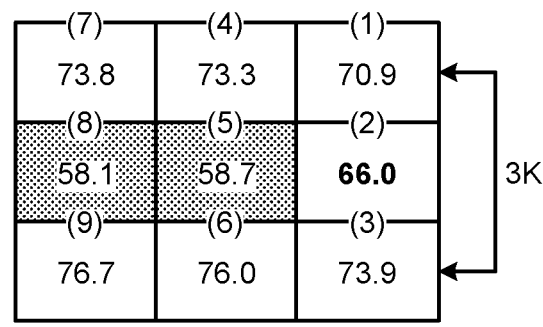
Figure 9:
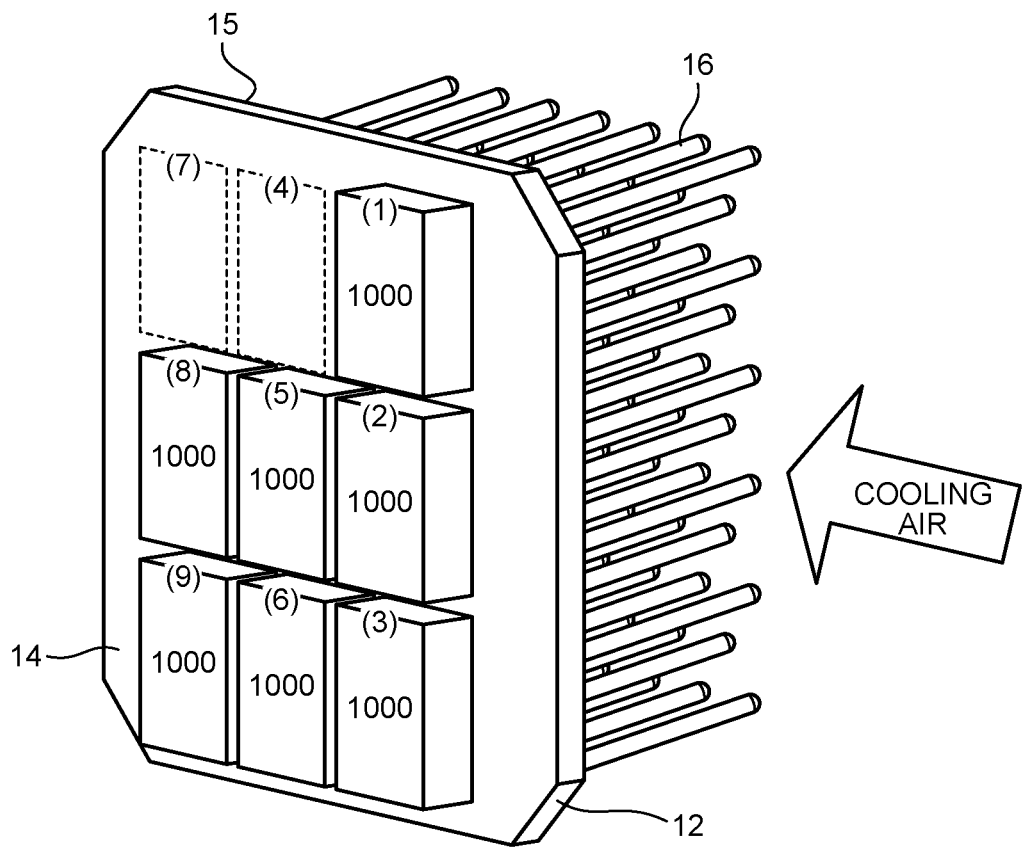
FIG. 9 is a diagram illustrating a third simulation result for describing the reason for arranging the main circuit elements as illustrated in FIG. 5.
Figure 10:
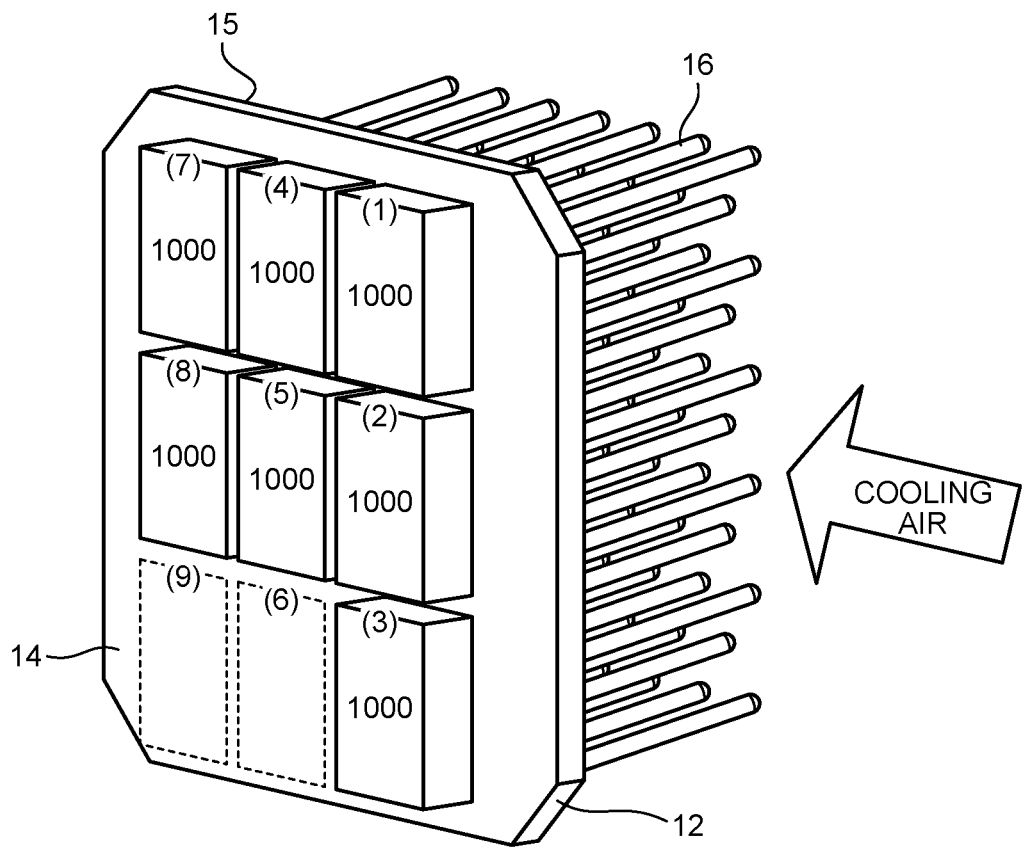
FIG. 10 is a diagram illustrating a fourth simulation result for describing the reason for arranging the main circuit elements as illustrated in FIG. 5.

Next, the reason why no module is mounted in the third section 43 when the converter main circuit is a two-level circuit will be described with reference to FIGS. 7 to 10. FIG. 7 is a diagram illustrating a first simulation result for describing a reason for arranging the main circuit elements as illustrated in FIG. 5. FIG. 8 is a diagram illustrating a second simulation result for describing the reason for arranging the main circuit elements as illustrated in FIG. 5. FIG. 9 is a diagram illustrating a third simulation result for describing the reason for arranging the main circuit elements as illustrated in FIG. 5. FIG. 10 is a diagram illustrating a fourth simulation result for describing the reason for arranging the main circuit elements as illustrated in FIG. 5.

A simulation model is illustrated in the upper part of each of FIGS. 7 to 10. As illustrated in each drawing, the simulation model is based on the assumption that a heat pipe method is used to perform cooling, and a large number of heat pipes 16 are provided on a second surface 15 which is opposite the first surface 14 of the base 12. The first surface 14 as the module mounting surface is divided into nine blocks, and the blocks are numbered from (1) to (9). Blocks (1) to (3) correspond to the first section 41 in FIGS. 5 and 6. Blocks (4) and (7) correspond to the second section 42 in FIGS. 5 and 6. Blocks (5) and (8) correspond to the third section 43 in FIGS. 5 and 6. Blocks (6) and (9) correspond to the fourth section 44 in FIGS. 5 and 6. Note that blocks (1), (4), and (7) are blocks on the upper side with respect to gravity, and blocks (3), (6), and (9) are blocks on the lower side with respect to gravity.

In addition, a rectangular parallelepiped box in each block illustrated in the upper part of FIGS. 7 to 10 is a heating element that indicates a module. FIG. 7 assumes a three-level converter main circuit, where all blocks are filled with module boxes. Meanwhile, FIGS. a to each assume a two-level converter main circuit, and no module is placed in same blocks. FIG. 7 corresponds to the second exemplary arrangement illustrated in FIG. 6, and FIG. 8 corresponds to the first exemplary arrangement illustrated in FIG. 5. In addition, a numerical value shown in each block represents the magnitude of current flowing through a module placed in a corresponding block. As illustrated in the drawings, the present simulation is based on the assumption that a current flowing through the module of the inverter main circuit and a current flowing through the module of the converter main circuit are equal. Furthermore, in the three-level converter main circuit, it is assumed that a current flowing through the outer element is ½ of a current flowing through the inner element.

Furthermore, in the lower parts of FIGS. 7 to 10, temperature rise values observed after a certain current flows through the blocks having the sane initial temperature are represented as numerical values. Note that in FIGS. 7 to 10, a current flowing through the converter main circuit and a current flowing through the inverter main circuit are equal.

The following can be seen from the simulation results illustrated in FIGS. 7 to 10.

(i) Blocks (1), (4), and (7) have been compared with blocks (3), (6), and (9) in each of FIGS. 7 and 8. Blocks (4) and (7) in FIG. 9 have been compared with blocks (6) and (9) in FIG. 10. In addition, blocks (6) and (9) in FIG. 9 have been compared with blocks (4) and (7) in FIG. 10. As a result, it can be seen that the cooling efficiency is higher on the upper side.

(ii) Comparison between FIG. 9 and FIG. 10 shows that the cooling efficiency in FIG. 10 is higher an average. This is partially due to the result set forth in (i) above.

(iii) In FIGS. 9 and 10, temperature is highest at a heating element (block (9) in FIG. 9, and block (7) in FIG. 10) located downstream and farthest from the non-mounting portion.

(iv) Among FIGS. 8 to 10, a difference ΔT in heating element temperature is smallest in FIG. 8 (ΔT=Tmax−Tmin=10.7K: difference between (9) and (2)).

(v) Among FIGS. 8 to 10, the maximum value Tmax of increase in cooler temperature in the converter main circuit is smallest in FIG. 8 (FIG. 8: Tmax=76.7K, FIG. 9: Tmax=82.6K, and FIG. 10: Tmax=79.2K).

Based on the above results, the arrangement configuration of FIG. 9 is adopted in the first embodiment. When a two-level converter main circuit is used as the converter main circuit, no module is mounted in the third section 43, and the main circuit elements of the converter are arranged in sections other than the third section 43, that is, the second section 42 and the fourth section 44, as described above.

As described above, the power conversion apparatus according to the first embodiment includes the first switching elements and the second switching elements. The first switching elements are modularized in units of one or more elements to form first modules. The second switching elements are modularized in units of one or more elements to form second modules. The first and second modules are mounted on a first surface that is a module mounting surface of a base of the cooler. The first modules are arranged in the first direction on the first surface. The second modules are arranged such that two or more second modules are continuously arranged in the second direction orthogonal to the first direction an the first surface. As a result, the cooling efficiency can be improved in the configuration in which the modules of both the inverter main circuit and the converter main circuit are cooled by the common cooler.

In addition, mainstream drive systems of electric vehicles include "truck control" and "collective control". In the 'truck control', four motors for driving electric vehicles are mounted on a truck and driven in twos. In the "collective control", four motors for driving electric vehicles are collectively driven. In the related art, a system configuration for the "truck control" is greatly different from a system configuration for the "collective control", so that it has been necessary to individually design the configuration of the main conversion device for each drive system. In contrast, the power conversion apparatus according to the first embodiment can reduce individual design changes to a required minimum even if the drive system is changed. In addition, since the present embodiment has adopted a configuration in which the modules of both the inverter main circuit and the converter main circuit are cooled by the common cooler, it is not necessary to design the power conversion apparatus in such a way as to increase the distance between a cooler on the windward side (for example, a converter cooler) and a cooler on the leeward side (for example, an inverter cooler) as in the related art. As a result, the length of the electric vehicle in a traveling direction can be shortened, and the main conversion device can be downsized.

Second Embodiment

Figure 11:
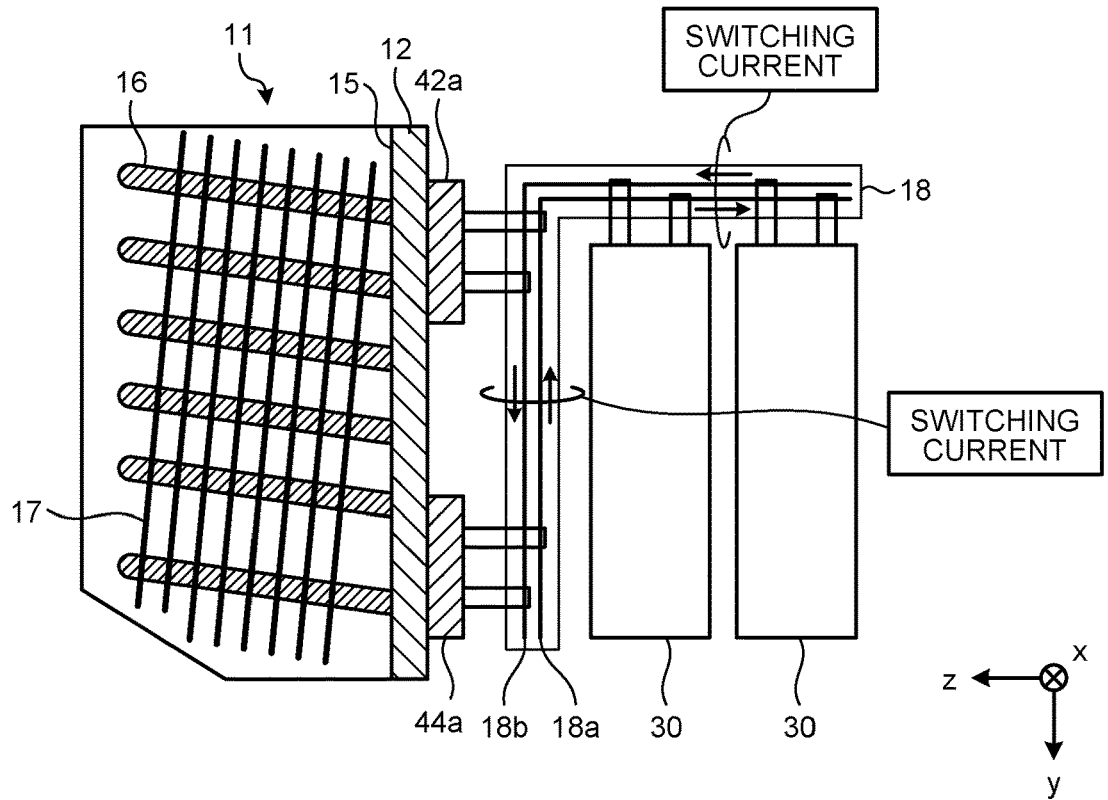
FIG. 11 is a first diagram for describing a configuration of a main part in a second embodiment.
Figure 12:
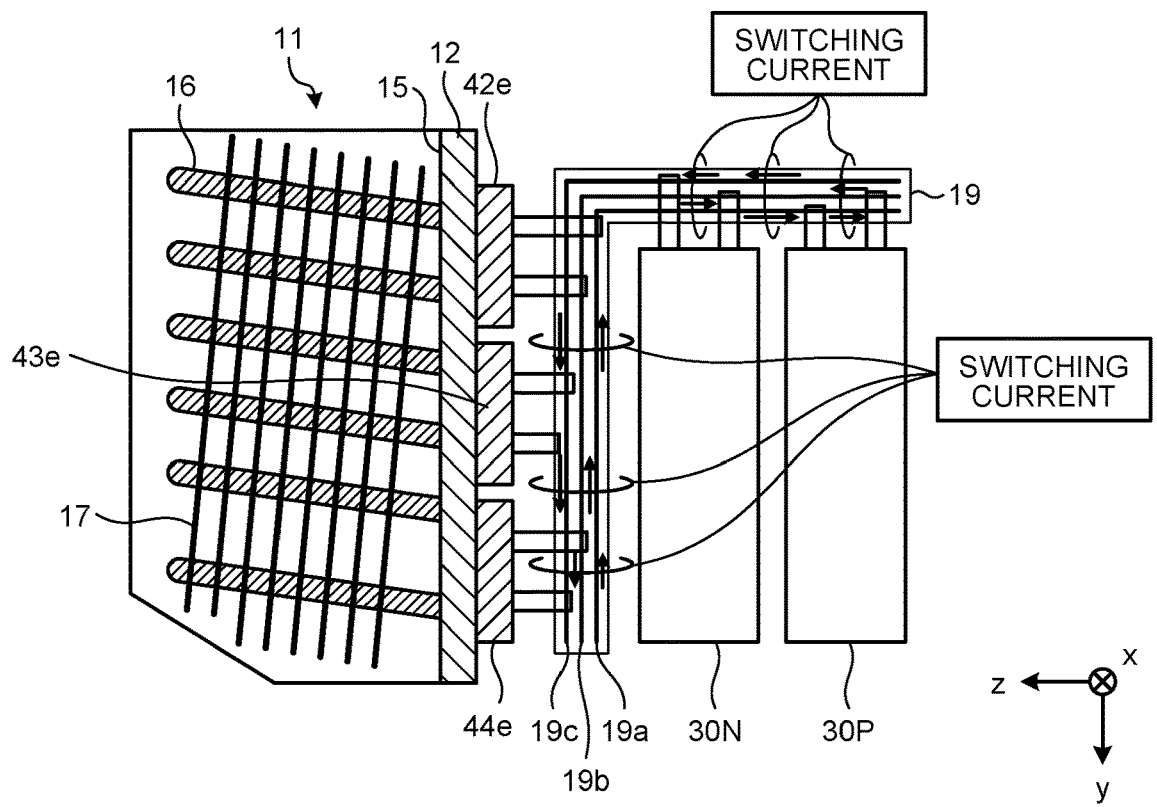
FIG. 12 is a second diagram for describing the configuration of the main part in the second embodiment.

In a second embodiment, a description will be given of a connection form of main circuit wires for further improving the cooling performance in addition to the effects of the first embodiment. FIG. 11 is a first diagram for describing a configuration of a main part in the second embodiment. FIG. 11 illustrates a configuration in which the modules 42a and 44a in the standard package illustrated in FIG. 5 and the filter capacitor 30 are electrically connected by a laminated bus bar 18 that is a main circuit wire. Furthermore, FIG. 12 is a second diagram for describing the configuration of the main part in the second embodiment. FIG. 12 illustrates a configuration in which the modules 42e, 43e, and 44e in the standard package illustrated in FIG. 6 and the filter capacitors 30P and 30N are electrically connected by a laminated bus bar 19 that is a main circuit wire. Furthermore, in FIGS. 11 and 12, the same or equivalent components am those described in the first embodiment are denoted by the same reference numerals, and redundant description is appropriately omitted. Note that each main circuit wire includes a wire portion through which a direct-current component of switching current flows and a wire portion through which an alternating-current component of the switching current flows, but for the make of simplicity, only the wire portion through which the direct-current component of the switching current flows is illustrated in each of FIGS. 11 and 12.

The cooler 11 includes a plurality of the heat pipes 16 and a plurality of fins 17. The heat pipes 16 project from the second surface 15 of the base 12 and are inclined upward. The fine 17 have a rectangular flat plate-like shape, and are fixed to the plurality of heat pipes 16. That is, the heat pipes 16 are arranged in a matrix on the second surface 15 of the base 12 such that the heat pipes 16 project from the second surface 15 and are inclined upward at a certain angle to a line perpendicular to the second surface 15 of the base 12. Each fin 17 has a plurality of through holes, and the heat pipes 16 are inserted into the through holes. Note that although FIGS. 11 and 12 each illustrate a case where the number of the heat pipes 16 is six and the number of the fins 17 is eight as an example, the configuration is not limited to thereto.

In FIGS. 11 and 12, an x-axis represents a direction in which cooling air flows, which is the second direction described above. A y-axis represents the above-described first direction orthogonal to the second direction. A z-axis represents a third direction orthogonal to both the first and second directions. Terminals of each module extend in the third direction, and terminals of each capacitor extend in the first direction. Note that the arrangements of the capacitors illustrated in FIGS. 11 and 12 are examples, and the arrangement of the capacitors is not limited to these arrangements. The terminals of each capacitor may extend in a direction other than the first direction.

In FIG. 11, the filter capacitor 30 and the modules 42a and 44a are electrically connected by the laminated bus bar 19 having an L-shaped cross section. Furthermore, in FIG. 12, the filter capacitors 30P and 30N and the modules 42e, 430, and 44e are electrically connected by the laminated bus bar 19 having an L-shaped cross section. The laminated bus bars 15 and 19 are parts in which a thin metal plate and an insulator are integrally covered with a laminate material. FIG. 11 illustrates a first conductor 18a and a second conductor 18b each formed as a thin metal plate. FIG. 12 illustrates a first conductor 19a, a second conductor 19b, and a third conductor 19 each formed as a thin metal plate. Note that a laminated bus bar not covered with a laminate material may be used instead of the laminated bus bars 18 and 19. Furthermore, the cases where the laminated bus bars 19 and 19 each have an L-shaped cross section have been illustrated in FIGS. 11 and 12 as an example, but this is not a limitation. The cross sections of the laminated bus bars 18 and 19 may be in a shape other than an L-shape.

In FIG. 11, when the switching elements of the modules 42a and 44a perform switching operation, a switching current flows through the first conductor lea and the second conductor 18b included in the laminated bus bar 18. Furthermore, in FIG. 12, when the switching elements of the modules 42e and 430 perform switching operation, a switching current flows through the first conductor 19a and the second conductor 19b included in the laminated bus bar 19. Furthermore, when the switching elements of the modules 430 and 44e perform switching operation, a switching current flows through the second conductor 19b and the third conductor 19c included in the laminated bus bar 19. These switching currents serve as reciprocating currents flowing in opposite directions at the same time as illustrated in the drawings. Therefore, magnetic flux generated around the laminated bus bare 18 and 19 will be canceled by the reciprocating currents. Furthermore, since the elements are arranged in such a way as to minimize an inductance loop in each of FIGS. 11 and 12, main circuit inductance can be reduced.

As described above, according to the power conversion apparatus in the second embodiment, the above characteristics enable a reduction in surge voltage to be generated at the time of switching the main circuit elements. Furthermore, the three-level configuration illustrated in FIG. 12 is also advantageous in that a snubber circuit is not necessary. In addition, in a case where the main circuit elements are arranged in parallel, it is also possible to obtain the effect of equalizing the values of currents flowing through the elements arranged in parallel. Moreover, a reduction in surge voltage enables switching speed to be increased. An increase in switching speed is equivalent to an increase in the speed of turning off the switching operation, and can be achieved by a reduction in resistance. A reduction in resistance enables heat lose to be reduced. Therefore, the cooling performance can be improved.

Note that the configuration illustrated in each of the above embodiments shows an example of the subject matter of the present invention, and it is possible to combine the configuration with another technique that is publicly known, and is also possible to omit or change part of the configuration without departing from the gist of the present invention.

REFERENCE SIGNS LIST 1 overhead line; 2 current collector; 3 wheel; 4 rail; 6 transformer; a contactor; 11 cooler; 12 base; 14 first surface;

15 second surface; 16 heat pipe; 17 fin; 18, 19 laminated bus bar; 18a, 19a first conductor; 1ab, 19b second conductor; 19c third conductor; 20, 20a, 20b converter main circuit; 30, 30P, 30N filter capacitor; 40, 40a inverter main circuit; 41 first section; 41a, 41b, 41c, 41d, 415, 41f, 42a, 42b, 42c, 42d, 42e, 42f, 42g, 42h, 43e, 43f, 43g, 43h, 44a, 44b, 44c, 44d, 44e, 44f, 44g, 44h module; 42 second section; 43 third section; 44 fourth section; 9o motor; 100 power conversion apparatus; UD1A, UD1B, UD2A, UD2B, VD1A, VD1B, VD2A, VD2B diode; UPC, VPC, UNC, VNC, UPI, VPI, NPI, UNI, VNI, WNI, UNC1, UNC2, UNC3, UNC4, UNC3A, UNC3B, UNC4A, UNC4B, UNI1, UNI2, UPC1, UPC2, UPC3, UPC4, UPC1A, UPC1B, UPC2A, UPC2B, UPI1, UPI2, VNC1, VNC2, VNC3, VNC4, VNC3A, VNC3B, VNC4A, VNC4B, VPC1, VPC2, VPC3, VPC4, VPC1A, VPC1B, VPC2A, VPC2B, VPI1, VNI1, VPI2, VNI2, WNI1, WNI2, WPI1, WPI2 switching element.

The invention claimed is:

1. A power conversion apparatus comprising:
a converter main circuit to convert AC power into DC power;
an inverter main circuit to convert, into AC power, the DC power obtained by conversion by the converter main circuit; and
a cooler to cool first switching elements included in the inverter main circuit and second switching elements included in the converter main circuit, the cooler being used as a common cooler, wherein
the first switching elements are modularized in units of one or more elements to form first modules,
the second switching elements are modularized in units of one or more elements to form second modules,
the first and second modules are mounted on a first surface that is a module mounting surface of a base of the cooler,
the first modules are arranged in a first direction on the first surface,
the second modules are arranged such that two or more second modules are continuously arranged in a second direction orthogonal to the first direction on the first surface,
the first modules are arranged in a first section of the first surface,
the second modules are arranged in at least a second section and a fourth section, and a third section is disposed between the second section and the fourth section, and
the second, third, and fourth sections are adjacent to the first section along the second direction, and are arranged in order of the second, third, and fourth sections along the first direction.

2. The power conversion apparatus according to claim 1, wherein
the second direction is a direction of cooling air that flows into and out of the cooler.

3. The power conversion apparatus according to claim 1, wherein
the first modules are each a two-element module configured such that two of the first switching elements are housed in one module, and
the second modules are each a two-element module configured such that two of the second switching elements are housed in one module.

4. The power conversion apparatus according to claim 1, wherein
the converter main circuit is a two-level converter main circuit,
the inverter main circuit is a two-level inverter main circuit, and
none of the second modules is mounted in the third section.

5. The power conversion apparatus according to claim 4, wherein
the first modules are arranged in the first section, the first modules operating as first-phase, second-phase, and third-phase switching elements of the inverter main circuit,
the second modules are arranged in the second section, the second modules operating as first-phase switching elements of the converter main circuit, and
the second modules are arranged in the fourth section, the second modules operating as second-phase switching elements of the converter main circuit.

6. The power conversion apparatus according to claim 1, wherein
the converter main circuit is a three-level converter main circuit,
the inverter main circuit is a two-level inverter main circuit, and
the second modules are mounted in the third section.

7. The power conversion apparatus according to claim 6, wherein
the first modules are arranged in the first section, the first modules operating as first-phase, second-phase, and third-phase switching elements of the inverter main circuit,
the second modules are arranged in the second section, the second modules operating as upper potential-side outer elements of the converter main circuit,
the second modules are arranged in the third section, the second modules operating as inner elements of the converter main circuit, and
the second modules are arranged in the fourth section, the second modules operating as lower potential-side outer elements of the converter main circuit.

8. The power conversion apparatus according to claim 4, comprising:
a filter capacitor to smooth DC voltage output from the converter main circuit, wherein
terminals of the first and second modules extend in a third direction orthogonal to each of the first and second directions,
the terminals of the first and second modules and a terminal of the filter capacitor are electrically connected by a bus bar, and
a reciprocating current flows between a plurality of conductors included in the bus bar.

9. The power conversion apparatus according to claim 6, comprising:
a filter capacitor to smooth DC voltage output from the converter main circuit, wherein
terminals of the first and second modules extend in a third direction orthogonal to each of the first and second directions,
the terminals of the first and second modules and a terminal of the filter capacitor are electrically connected by a bus bar, and
a reciprocating current flows between a plurality of conductors included in the bus bar.

* * * * *